United States Patent
Merced Grafals et al.

(10) Patent No.: US 9,805,770 B1
(45) Date of Patent: Oct. 31, 2017

(54) MEMRISTOR ACCESS TRANSISTOR CONTROLLED NON-VOLATILE MEMORY PROGRAMMING METHODS

(71) Applicant: HEWLETT PACKARD ENTERPRISE DEVELOPMENT LP, Houston, TX (US)

(72) Inventors: Emmanuelle J. Merced Grafals, Palo Alto, CA (US); John Paul Strachan, San Carlos, CA (US); Noraica Davila, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/217,739

(22) Filed: Jul. 22, 2016

(51) Int. Cl.
| | |
|---|---|
| G11C 7/00 | (2006.01) |
| G11C 13/00 | (2006.01) |
| G11C 11/56 | (2006.01) |
| H01L 23/528 | (2006.01) |

(52) U.S. Cl.
CPC ............ *G11C 7/00* (2013.01); *G11C 11/5614* (2013.01); *G11C 13/003* (2013.01); *G11C 13/004* (2013.01); *G11C 13/0064* (2013.01); *G11C 13/0069* (2013.01); *G11C 13/0097* (2013.01); *H01L 23/528* (2013.01)

(58) Field of Classification Search
CPC .............. G11C 13/004; G11C 13/0064; G11C 13/0069; G11C 13/0097; G11C 13/003
See application file for complete search history.

(56) References Cited

U.S. PATENT DOCUMENTS

| | | | | |
|---|---|---|---|---|
| 8,179,714 B2 * | 5/2012 | Takagi | ............... | G11C 13/0007 365/148 |
| 2005/0174840 A1 * | 8/2005 | Tsushima | ............ | G11C 11/5614 365/185.03 |
| 2008/0062740 A1 * | 3/2008 | Baek | .................. | G11C 13/0007 365/148 |
| 2008/0130381 A1 * | 6/2008 | VanBuskirk | ....... | G11C 13/0007 365/189.16 |
| 2011/0310653 A1 | 12/2011 | Kreupl et al. | | |
| 2014/0166957 A1 | 6/2014 | Yang et al. | | |
| 2015/0052093 A1 | 2/2015 | Canoy et al. | | |
| 2015/0340316 A1 * | 11/2015 | Or-Bach | ................ | G11O 5/025 257/2 |

FOREIGN PATENT DOCUMENTS

CN    103165179    6/2013

OTHER PUBLICATIONS

Borghetti J. et al., "A Hybrid Nanomemristor/Transistor Logic Circuit Capable of Self-Programming", (Research Paper), Feb. 10, 2009, pp. 1699-1703, vol. 106, No. 6, 5 pages.
Chen B. et al., Highly Compact (4F2) and Well Behaved Nano-Pillar Transistor Controlled Resistive Switching Cell for Neuromorphic System Application, (Research Paper), Oct. 31, 2014, 5 pages.

* cited by examiner

*Primary Examiner* — Harry W Byrne
*Assistant Examiner* — Ajay Ojha
(74) *Attorney, Agent, or Firm* — Hewlett Packard Enterprise Patent Department

(57) ABSTRACT

A set procedure of a one transistor, one memristor memory elements may comprise determining a gate voltage for the transistor based on the desired target value. Increasing set pulses may be applied to memristor while the gate is held at the determined gate voltage.

20 Claims, 8 Drawing Sheets

MEMRISTOR ACCESS TRANSISTOR CONTROLLED NON-VOLATILE MEMORY PROGRAMMING METHODS

BACKGROUND

A one transistor, one memristor (1T1R) storage element comprises a memristor coupled to a transistor. The gate of the transistor is used to control access to the memristor. Storing a value in the 1T1R element comprises setting a conductance (or, equivalently, a resistance) of the memristor. Generally, memristors may be set or reset. Setting the memristor refers to raising the conductance of the memristor from its present value, while resetting the memristor refers to lowering the conductance of the memristor from its present value. In a bipolar memristor, setting the memristor comprises applying a voltage to a first electrode (the "top electrode") and connecting a second electrode (the "bottom electrode") to ground. Resetting the memristor comprises connecting the top electrode to ground and applying a voltage to the bottom electrode.

BRIEF DESCRIPTION OF THE DRAWINGS

Certain examples are described in the following detailed description and in reference to the drawings, in which.

DETAILED DESCRIPTION OF SPECIFIC EXAMPLES

Implementations of the described technology vary gate voltages applied to access transistors of 1T1R elements according to the target values to be stored in the corresponding memristors. This may reduce the number of programming pulses required to achieve the desired target values compared to setting the access transistors at voltages that minimize the transistor resistances.

Figure 1:
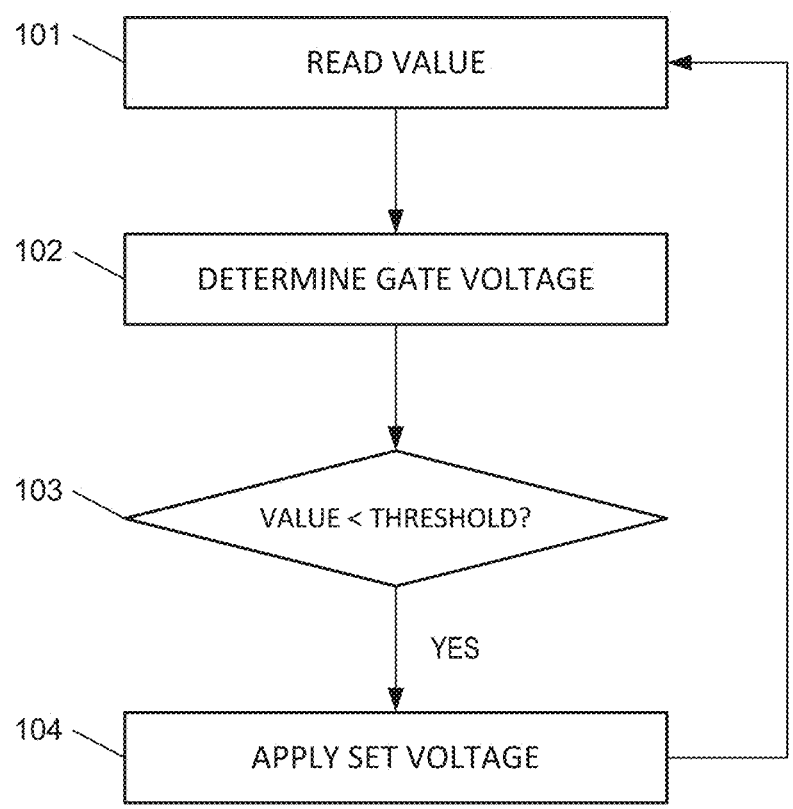
FIG. 1 illustrates an example method of storing a value of a multilevel memristor of a 1T1R element.

FIG. 1 illustrates an example method of storing a value of a multilevel memristor of a 1T1R element.

The method includes block 101. Block 101 may include reading a value of the 1T1R element. As an example, reading operation of block 101 may be performed a first time after receiving a new target value for the memristor. Block 101 may comprise reading the current conductance or resistance of the memristor. For example, reading the element may comprise applying a low read voltage across the memristor and source and drain of the access transistor and a high read voltage to the gate of the access transistor. The low read voltage may be sufficiently low to avoid perturbation of the memristor state. For example, with a tantalum oxide ($TaO_x$) memristor, the read voltage may be 0.1V. The high access transistor gate read voltage may be sufficiently high to ensure that the transistor is in its linear region (having a constant conductance). For example, the access transistor gate voltage for an N-type CMOS access transistor fabricated in a 2.6 µm process may be 5 V.

Figure 2:
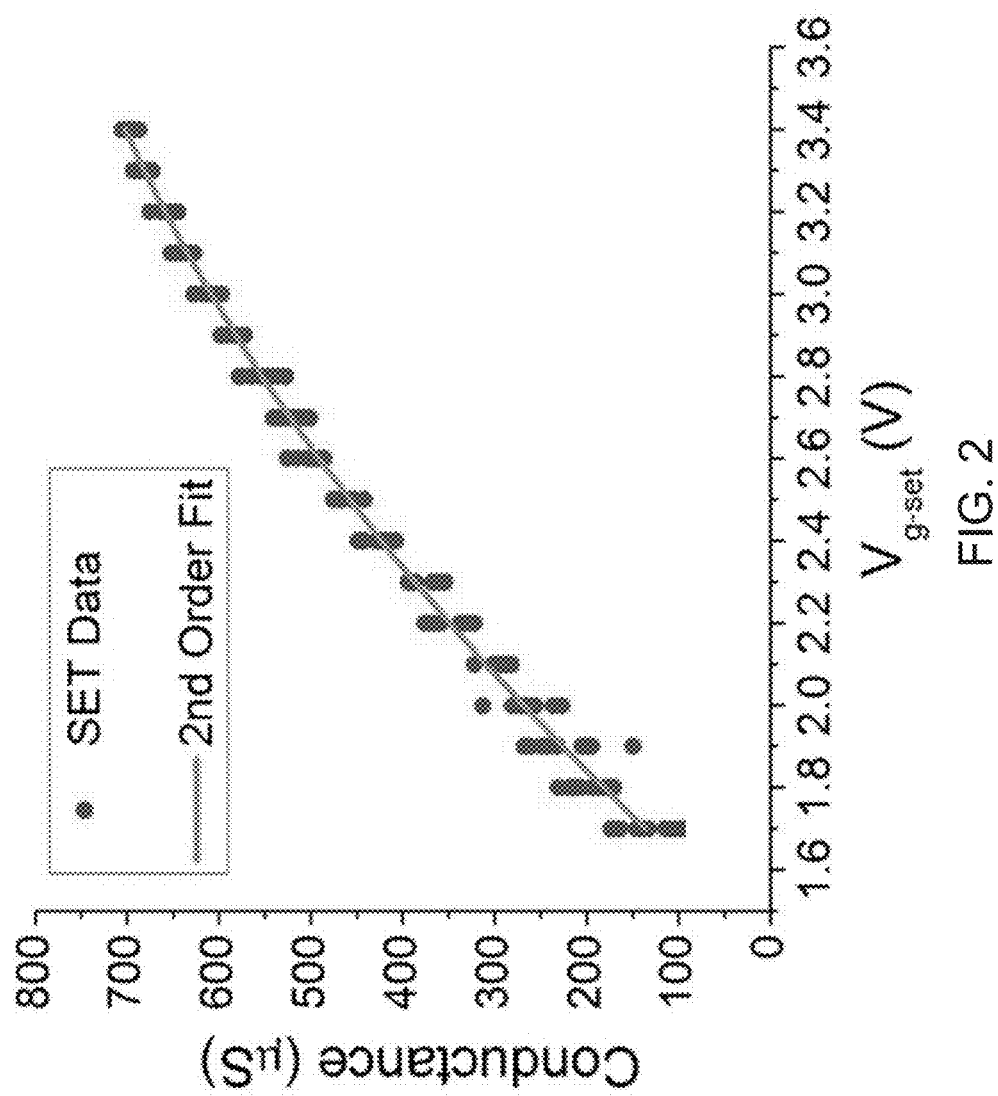
FIG. 2 illustrates conductances read at different gate voltages after applying 50 ns voltage pulses at 1.1V.

The method further includes block 102. Block 102 comprises determining a gate voltage for the access transistor of the 1T1R element based on a target value for the memristor. In some implementations, data may be gathered by applying voltage pulses to the memristor at different gate voltages. In other implementations, data may be gathered by applying multiple voltage pulses at a fixed gate voltage. A function fitted to the resulting data may be used to generate the gate voltage based on the target value. For example, FIG. 2 illustrates conductances read at different gate voltages after applying 50 ns voltage pulses at 1.1V. Each gate voltage received 10 pulses and the resulting conductance was read after each pulse. The data was gathered from a disk shaped $TaO_x$ memristor with a diameter of approximately 2 µm and a switching layer thickness of approximately 12 nm. The resulting fit, in this case, can be approximated as a quadratic polynomial: $V_{g\text{-}set}=2.03713\times10^6 G_{set}^2+1.22142\times10^3 G_{set}+1.51291$, where $G_{set}$ is the measured conductance and $V_{g\text{-}set}$ is the applied gate voltage. Other memristors with differing physical or material parameters are expected to have similar quadratic relationships. For example, similar data is expected from tantalum oxide, hafnium oxide, titanium oxide, or other types of memristor. Additionally, similar data is expected from films with different thicknesses and widths. In some implementations, the relationship between the gate voltage and the desired conductances may be measured for the specific physical device characteristics employed. In other implementations, the relationship may be measured for the specific devices to be used in the system. As a further example, a test device from the same wafer as the devices to be employed may be used to measure and calibrate the specific relationship.

As described above, implementations may use resistance as the target value rather than conductances. While the application discusses the disclosed technology with regard to conductance, appropriate changes may be made to apply to resistances by inverting the conductance values to achieve target resistances. For example, the above relationship may be measured with regard to resistance.

In some cases, block 102 may comprise solving such a function for $V_{g\text{-}set}$ using the target conductance. In other cases, the relationship may be used to generate a look-up table for predetermined possible target conductances, and block 102 may comprise using the lookup table to obtain the gate voltage for the current target conductance.

In further implementations the relationship between set gate voltage and the target value may be based on further parameters. For example, block 102 may comprise storing historical information of voltages applied to the memristor. The gate voltage may be further based on this historical information. For example, the historical information may comprise the highest voltage previously applied to the memristor. The function used to determine the gate voltage may incorporate this information. For example, a function of the historical information may provide an offset to the function of gate voltages to target values. For example, the final function may have the form $V_{g\text{-}set}=f(G_{target})+h(V_{historic})$.

The example method may further include block 103. Block 103 may comprise determining if the value read in block 101 is below a target value range. For example, block 103 may comprise determining if the current conductance of the memristor is less than the lower end of the acceptable range about the target conductance. The target value range may be a range of conductances about the target conductance that are distinguishable from neighboring target conductance ranges. In some implementations, the acceptable range about the target value may depend on the number of possible target conductances. A system allowing fewer possible conductances may have larger ranges than a system allowing more possible conductances.

The example method may further include block 104. In block 104, a set voltage is applied to the memristor while holding the access transistor gate voltage at the voltage determined in block 102. For example, a voltage pulse may be applied to the top electrode of the memristor while the bottom electrode is coupled to ground. This may raise the conductance of the memristor towards the target value.

The example method may then repeat from block 101. In the second iteration, the value of the 1T1R element may be read a second time. If the value remains below the acceptable range in block 103, a second set voltage is applied to the electrode of the memristor in block 103, using the same gate voltage from block 102. The method may continue by alternating applying increasing set voltages to the 1T1R element and reading the value of the 1T1R element until the value read is within the target value range or the value read is above the target value range. For example, increasing voltage pulses may be applied until the conductance is within the target range or the conductance overshoots (is above the target range) the target.

Figure 3:
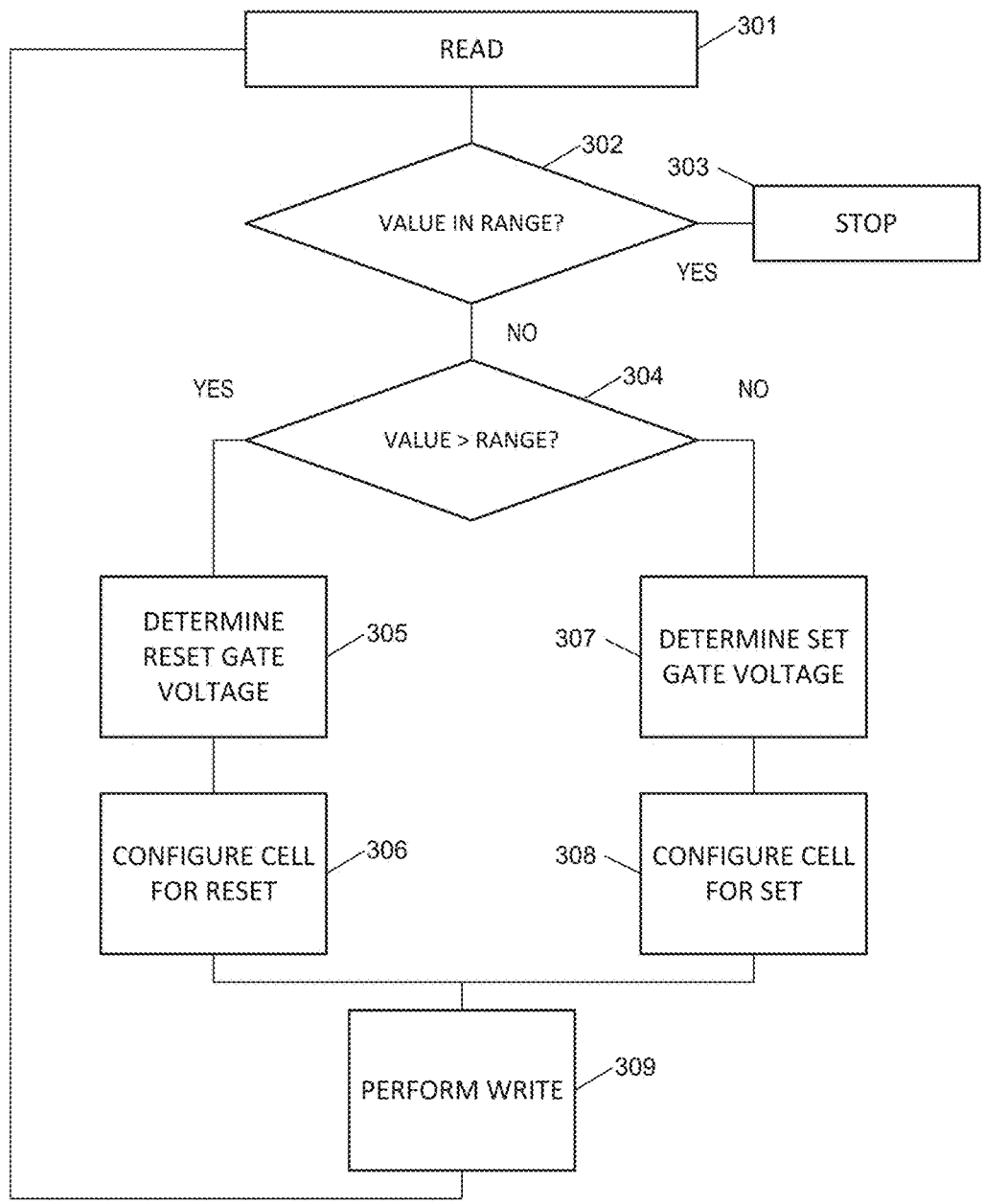
FIG. 3 illustrates another example method of writing a value to a multilevel 1T1R element.

FIG. 3 illustrates another example method of writing a value to a multilevel 1T1R element. The method includes iteratively setting and resetting the memristor until a target value is achieved.

The example method begins with block 301. In block 301, the current value of the memristor is read. For example, reading operation of block 301 may performed as described with respect to block 101 of FIG. 1. In some cases, the illustrated method may be performed simultaneously on a set of 1T1R elements. For example, the method may be performed simultaneously on any elements that may be independently controlled. For example, for an array of elements arranged in a crossbar, the method may be performed simultaneously on a row, column, or the entire array.

After the current value is read, decision 302 is performed to determine if the current value is in range of the target value. For example, decision 302 may be performed as described with respect to block 102 of FIG. 1. In implementations where multiple memristors are programmed simultaneously, decision 302 may comprise simultaneously reading the memristors, or sequentially reading the memristors. After block 302, the method stops in block 303 for any memristors that have values within range of the target value.

Decision 304 is performed to determine if the current value is above or below the target range. If the target value is a conductance and above the target value range, then the method proceeds to a reset of the memristor in blocks 305-306. Similarly, if the targeted value is resistance, decision 304 is reversed. If the resistance is below the target range, then the method would proceed to a reset.

Block 305 comprises determining a reset gate voltage for the memristor. In some implementations, the reset gate voltage is independent of the target conductance. For example, the same reset gate voltage may be used for each target conductance. For example, a sufficiently high voltage to minimize the access transistor resistance, such as 5 V, may be used. In other implementations, a relationship between reset gate voltages and target conductances may be used. For example, certain materials may exhibit a relationship between reset gate voltage and target value. In further implementations, historical information regarding the memristor may be used to determine the reset gate voltage. For example, information regarding the highest voltage the memristor has been exposed to may be used to modify a default reset gate voltage.

In implementations where multiple elements are simultaneously programmed, block 305 may comprise determining a reset voltage for each element to be reset. Alternatively, block 305 may comprise using the same reset voltage for each element to be reset.

Block 306 comprises configuring the cell for the reset operation. For example, block 306 may comprise coupling the bottom electrode of the cell's memristor to a voltage pulse source and the top electrode of the cell's memristor to ground. The voltage pulse to be applied may depend on whether a previous reset voltage had been applied in a previous iteration of the method. If the immediately preceding iteration was a reset pulse, then the current reset pulse may be an incremental increase in voltage. If the current iteration is the first iteration after receiving the current target, or if the current iteration is the first iteration after overshooting the current target, then the reset pulse may be an initial voltage pulse. The initial voltage, pulse length, pulse shape, and voltage increase step size may depend on various factors, and may vary in different implementations. For example, these parameters may depend on material, physical parameters such as transistor or memristor size, number of possible stored levels, desired speed of operation, or endurance considerations. As an example, the initial voltage may be between 0.5V and 0.8V, the pulse length may be between 50 ns and 100 ns, and the voltage increase step size may be between 0.05V and 0.5V. In implementations with multiple simultaneous programming, each cell to be reset may be configured for the reset operation.

In decision 304, if the value is below the target value range then the method proceeds to a set of the memristor in blocks 307-308.

Block 307 comprises determining a gate voltage for the set operation. Block 307 may be performed as described with respect to block 102 of FIG. 1. In implementations where multiple elements are set simultaneously, block 307 may comprise determining a gate voltage for each element that will have a set operation.

Block 308 comprises configuring the cell for the set operation. For example, block 308 may comprise coupling the top electrode to a voltage pulse source and the bottom electrode to ground. In implementations with multiple simultaneous programming, each cell to be set may be configured for the set operation. Additionally, block 308 may comprise determining the characteristics of the voltage pulse to be used during the upcoming write attempt. If the current iteration is the first iteration for the current target value, or the previous iteration was a reset attempt, then the current voltage pulse may have an initial voltage. If the previous iteration was a set attempt, then the current voltage pulse may be a voltage step size increased over the previous attempt. As described with respect to block 306, the voltage pulse shape, length, initial size, and step size may depend on various characteristics and system design goals. In some implementations, the voltage pulses used for the set operations have the same length, initial size, and step size as the pulses used for the reset operations. In other implementations, the set pulses may have different parameters than the reset pulses.

Block 309 comprises performing a write attempt. For example, block 309 may comprise applying the voltage pulse as determined in blocks 306 or 308, depending on whether the current attempt is a reset or a set attempt. In implementations where multiple cells are programmed simultaneously, block 309 may comprise applying the voltage pulses to each cell being programmed.

After block 309, the method repeats from block 301. In some implementations, the method may repeat until the target value is reached. In other implementations, the method may repeat until the first of the target value being reached or a maximum number of write attempts are reached. For example, some applications, such as neural networks, require tuning the conductance in the right direction without necessarily achieving the target conductance. For example, a maximum of only two write pulses may result in convergence towards a target value. The maximum may be configured according to desired speed, accuracy, and endurance trade-offs.

Figure 4:
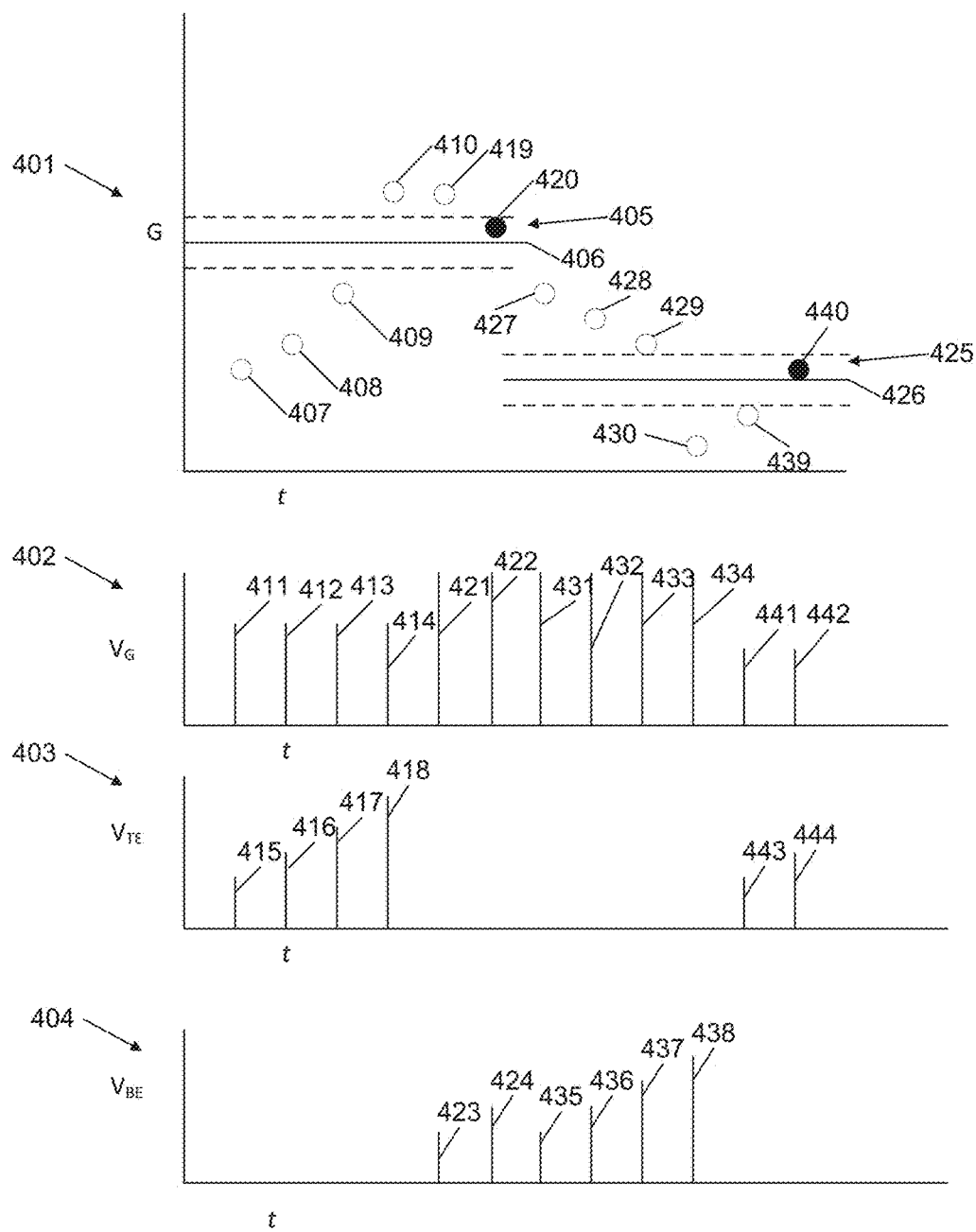
FIG. 4 illustrates an example application of the method of FIG. 3.

FIG. 4 illustrates an example application of the method of FIG. 3. FIG. 4 show four graphs. Graph 401 illustrates the conductances read on a 1T1R element while programming the element to a first target conductance 406 followed by programming the element to a second target conductance 426. Graph 402 illustrates the gate voltages applied during the write attempts resulting in the values read in graph 401. Graph 403 illustrates the top electrode voltages during the write attempts, while graph 404 illustrates the bottom electrode voltages during the write attempts.

In the illustrated example, the first write attempt is a set pulse. The gate voltage 411 is determined based on the target conductance 405. A series of four increasing set pulses 415, 416, 417, and 418 are applied to the memristor with the gate voltage at the determined level 411, 412, 413, 414. This results in read values 407, 408, 409, and 410, respectively. Read value 410 has overshot the range 405 about the target value 406, causing the system to begin applying reset pulses.

The access transistor gate is set to the reset voltage during pulses 421, 422 while increasing voltages are applied to the bottom electrode 423, 424. After two pulses the read conductance 420 is within the range 405 about the target conductance 406. In this example, the access gate voltage during reset is set high enough to minimize the transistor's resistance. However, as described above, other implementations may determine the reset voltage according to the target value.

After successfully programming the memristor to the first value 406, the illustrated example programs the memristor to a second target value 426.

The second target value is less than the first. Accordingly, the method begins by applying reset pulses 435-438 while applying the reset voltage to the access transistor 431-434. These pulses result in read conductances 427-430. Conductance 430 undershoots the target value 426, so the method switches to applying set pulses 443, 444. The set pulses are applied using a gate voltage 441, 442, determined according to the target conductance 426, until the read conductance 440 is within the range 425 of the target conductance 426.

Figure 5:
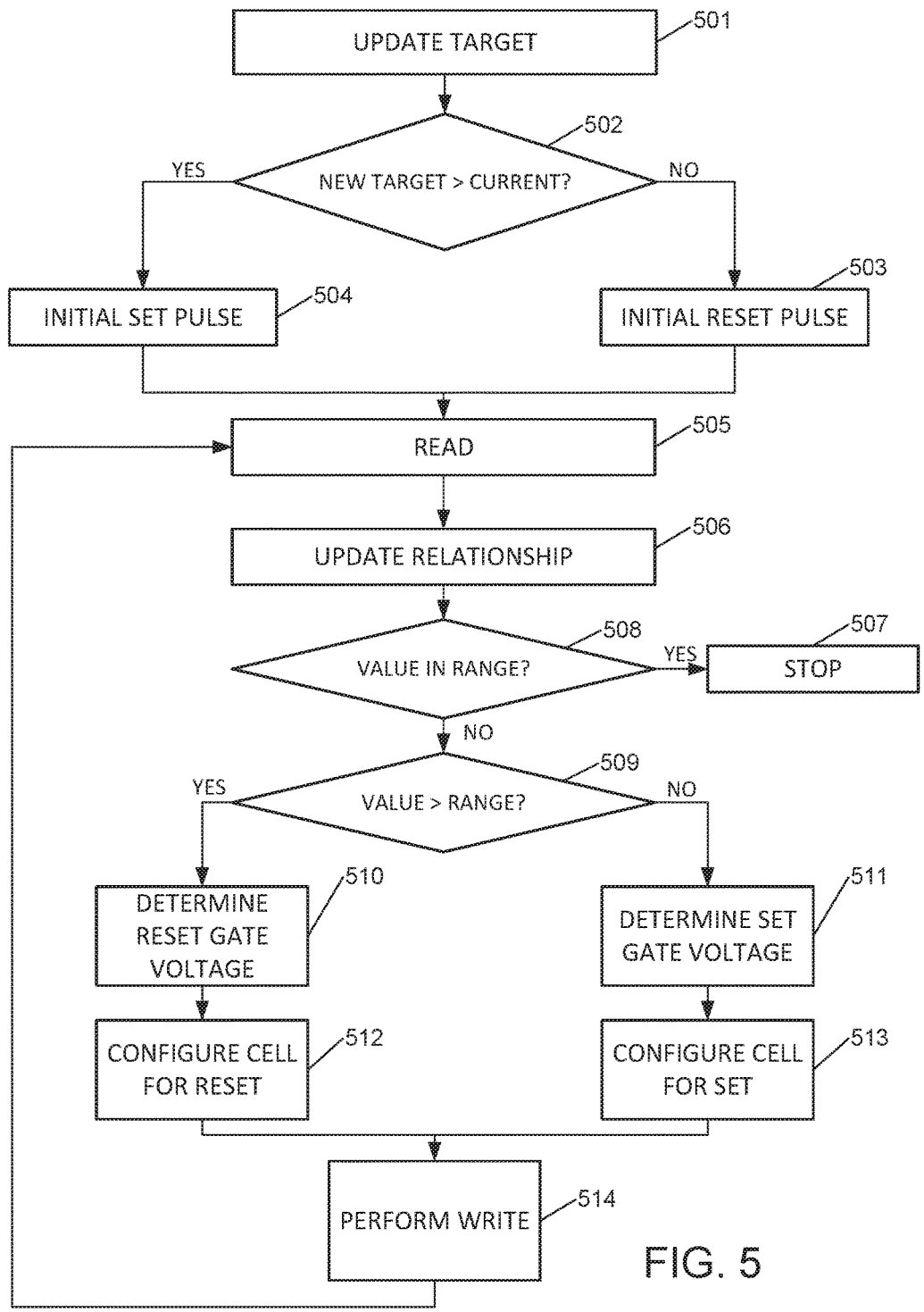
FIG. 5 illustrates an example method of programming a 1T1R element using initialization pulses.

FIG. 5 illustrates an example method of programming a 1T1R element using initialization pulses. The initialization pulses may be used when the target value of the 1T1R element changes, resulting in a faster convergence to the new value.

The example method begins with block 501. Block 501 comprises updating the target value for memristor of the 1T1R element. In decision 502, the system determines whether the new target value is greater than the old target value, which determines whether a set or reset initialization pulse will be applied.

If the new target is greater than the current value, then a set initialization pulse is applied in block 503. The set initialization voltage pulse may have an amplitude greater than the subsequent increasing voltage pulses. In some cases, the initialization voltage pulse may be at the same voltage used to gather the data used to determine the relationship between gate voltage and target value. For example, the initialization set pulse may be 1.1V or 1.4V, compared to an initial ramping voltage of 0.5 V or 0.8 V. During the set initialization pulse the access transistor gate voltage is set to the voltage determined according to the target conductance.

If the new target is less than the current value, then a reset initialization pulse is applied in block 504. The rest initialization pulse may have a greater voltage than what is applied during the ramping reset pulses. For example, a reset voltage of 1.75 V may be applied during the initialization. In some implementations, the access transistor gate voltage may be set to the single reset voltage used independent of the target conductance. In other implementations, the gate voltage may be set to a reset voltage that is based on the target conductance.

After the initialization pulse, the method proceeds as described with respect to FIG. 3. The current value is read in block 505, if the value is in range 508, then the method ends at 507. Otherwise, if the value is above the range 509, the access transistor is set to a reset voltage and the cell is configured at 512 for reset operation. If the value is under the range 509, then the access transistor is set to the set voltage and the cell is configured at 513 for set operation. After configuring the cell, the write attempt is performed 514 and the method repeats from step 505 until the target value is reached.

Additionally, the illustrated method comprises block 506. Block 506 may comprise refining the relationship used to determine the access transistor gate voltages using the data read during block 505. For example, the voltage used to gather the initial data may be the same as the initialization set pulse, and the value read after the initialization pulse may be added to the data set.

Figure 6:
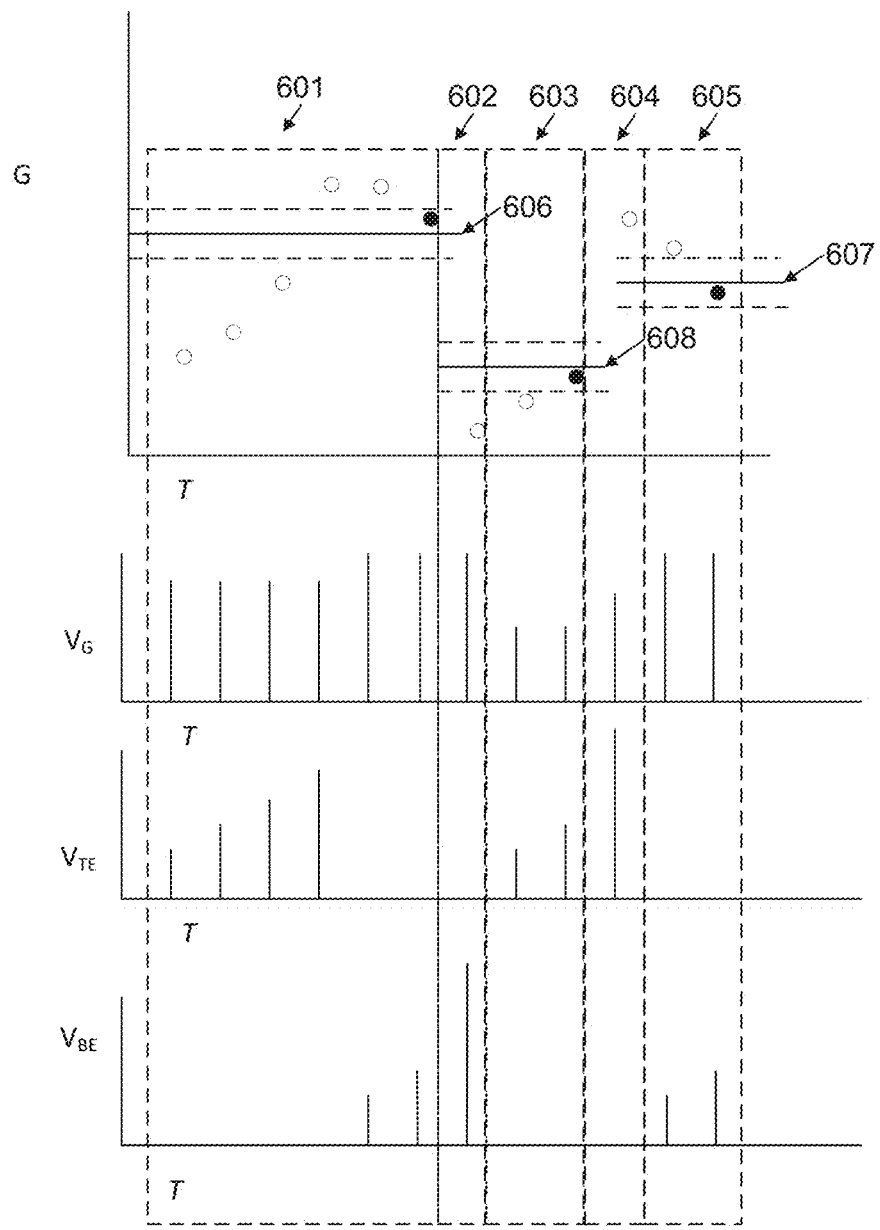
FIG. 6 illustrates example voltage pulses and read data during the application of the method of FIG. 5.

FIG. 6 illustrates example voltage pulses and read data during the application of the method of FIG. 5. Region 601 illustrates the application of the method while initially setting the memristor to value 606.

After the first value 606 is reached, the system is set to a new target value 608, less than the previous target value 606. Accordingly, an initialization reset pulse 602 is applied, resulting in a conductance under the new value. The system then applies increasing voltage pulses during region 603 until the target value 608 is reached.

Afterward, a third target value 607 is set, and the system applies an initialization set voltage. This results in the conductance overshooting the target value, with reset pulses during region 605 bring the conductance within range of the third target 607.

Figure 7:
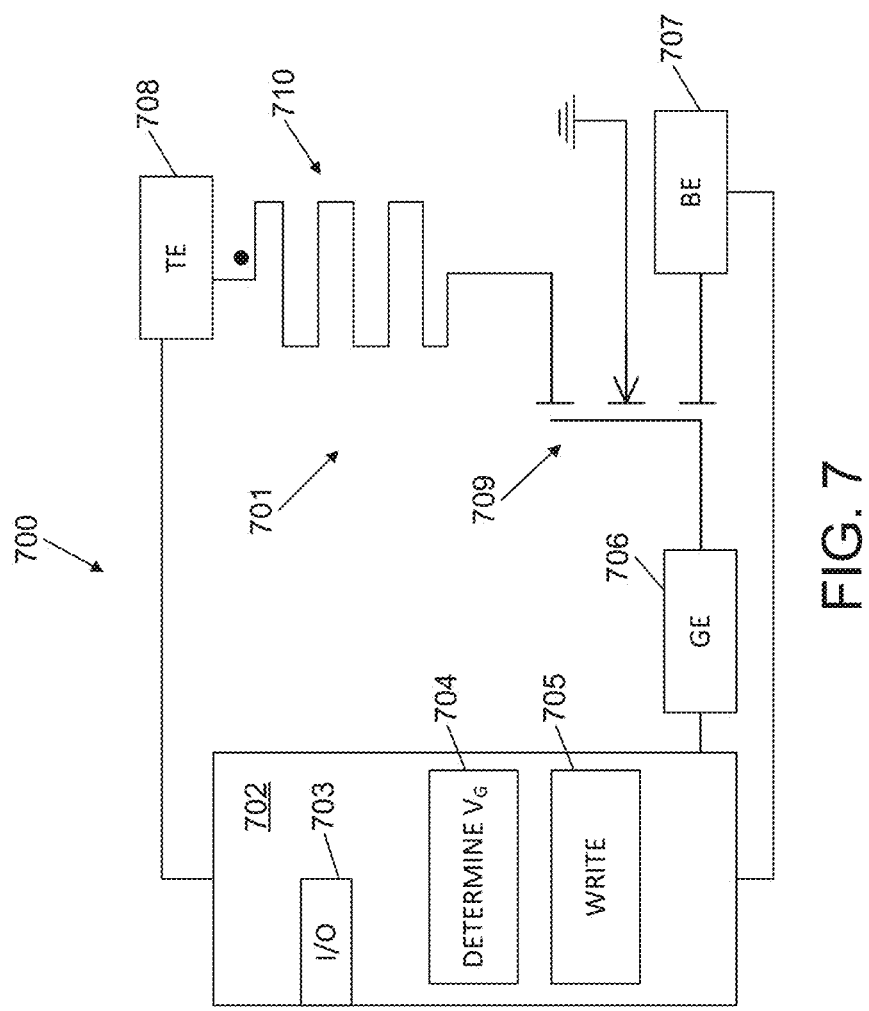
FIG. 7 illustrates a system including a memory element and a controller.

FIG. 7 illustrates a system 700 including a memory element 701 and a controller 702. The controller 702 includes various logic blocks 703, 704, 705. In various implementations, these blocks may be implemented in applications specific integrated circuits (ASICS), field programmable gate arrays (FPGAs), other hardware elements, software stored on a non-transitory medium and executed by a processing element, or a combination thereof.

The memory element comprises a memristor 710 coupled to an access transistor 709. For example, an electrode of the memristor 710 may be coupled to a source electrode of the transistor 709. For example, the element may comprise a bipolar memristor coupled to an N-type CMOS transistor.

The system 700 may further comprise a top electrode driver 708, a bottom electrode driver 707, and a gate driver 706. These drivers may be used by the controller to apply appropriate voltages, configure the device for reading, or connect the appropriate electrodes to ground.

The system 700 further comprises a controller 702. For example, the controller may implement logic to perform the methods of FIG. 1, 3, or 5.

The controller 702 may include an input/output module (I/O) 703. For the example, the I/O module 703 may include logic to receive system parameters, such as target values for the memristor, pulse lengths, pulse characteristics, or the relationship between the gate voltages and the target memristor values.

The controller 702 further includes logic 704 to determine a set gate voltage for a gate of the access transistor based on the target value. For example, the controller 702 may use the logic 704 to determine a set gate voltage as described with respect to blocks 102, 307, 504 or 511. For example, the controller 704 may use the logic 704 to set gate voltage from a relationship between target values and gate set voltages. As described above, in some cases, the controller may use historical information regarding the memory element and the target value to determine the set gate voltage. Additionally, the logic 704 may be used to establish the relationship based on the value of memristor after reading the memristor.

Additionally, the logic 704 may be used to determine the reset voltage to be used during reset operations. For example, the controller may use the logic 704 to determine the reset gate voltage from a relationship between target values and gate reset voltages.

The controller 702 further includes write logic 705. The write logic 705 may use the drivers 708, 706, 707 to apply write pulses to the element 701. For example, the controller may use the logic 705 to apply increasing set voltage pulses to a memristor until a value of the memristor is within a range about the target value or the value of the memristor overshoots the target value. These increasing pulses may be applied with the gate of the access transistor 709 held at the determined set voltage.

The write logic 705 may further apply reset voltage pulses. For example, the controller may use the logic 705 to apply increasing reset voltage pulses to the memristor until the value of the memristor is within the range about the target value or the value of the memristor undershoots the target value. For example, this may be performed if the value of the memristor overshoots the target value and may be performed with the gate of the access transistor 709 held at a reset gate voltage.

In some implementations, the logic 705 may be used to apply initialization voltage pulses prior to applying the increasing set or reset voltage pulses. For example, the controller may apply the initialization pulses after receiving a new target value. As described above, if the initialization pulse is a set pulse, the access transistor 709 gate voltage may be held at the set voltage determined according to the desired target value.

In some implementations, the logic 705 may be used to perform a set of write attempts for the memristor until the value is within a range about the target value or a maximum number of write attempts is reached. For example, the maximum number of write attempts may be set according to the desired level of convergence towards the target value.

In some cases, the I/O logic 703 may be used to receive an instruction to set the maximum number of write attempts. In other cases, I/O logic 705 may receive the number of possible values for the memristor, and the logic 705 may determine the maximum number of write attempts according the number of possible values.

Figure 8:
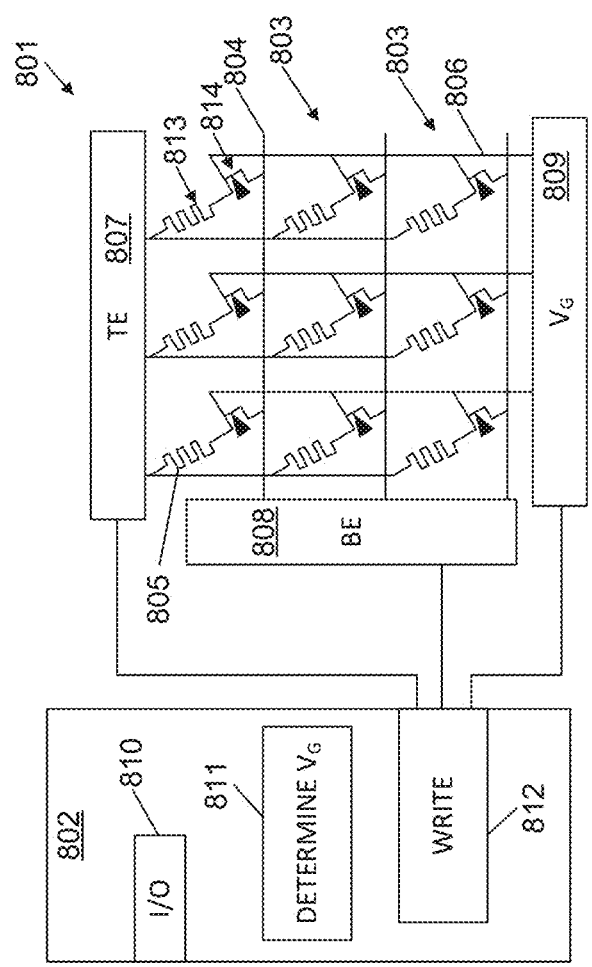
FIG. 8 illustrates an example system comprising multiple memory elements with independent programmability of the elements.

FIG. 8 illustrates an example system comprising multiple memory elements 803 with independent programmability of the elements. Each respective element 803 comprises a respective memristor 813 and access transistor 814. In this example the elements 803 are organized into a crossbar array with bottom electrode lines 804 controlled by a bottom electrode driver 808, top electrode lines 805 controlled by a top electrode driver 807 and gate lines 806 to control the gate voltages of the access transistors. In this example, independent control of the bottom electrode lines, top electrode lines and gate lines may allow independent setting of the elements 803 in a single row.

Other configurations may allow independent setting of other subsets of the elements 803, or the entire set of the elements 803. For example, another implementations may have vertical bottom electrode connections and horizontal gate electrode connections.

The system further comprises a controller 802. The controller 802 includes an I/O module 810. For example, the I/O module 810 may be as described with respect to I/O module 703 of FIG. 7. Additionally, the I/O module 810 may be used to receive different target values for different element addresses. Such values may be received simultaneously or sequentially in various implementations.

The controller 802 further comprises logic 811 to determine the appropriate voltages for the elements being simultaneously programmed. The variables determined and used by the logic 811, such as the gate voltages, target conductances, bottom electrode and top electrode may be treated as vectors sized according to the number of elements being simultaneously programmed. The controller 802 further comprises logic 812 to simultaneously apply the write pulses to the elements 803 being simultaneously programmed.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

The invention claimed is:

1. A method, comprising:
   reading a value of a one transistor, one memristor (1T1R) element a first time;
   determining a gate voltage for the 1T1R element based on a target value;
   if the value read the first time is below a target value range, applying the gate voltage to the gate of the 1T1R element and a first set voltage to an electrode of the memristor of the 1T1R element;
   reading the value of the 1T1R element a second time;
   if the second read value is below the target value range, applying the gate voltage to the gate of the 1T1R element and a second set voltage to the electrode of the memristor of the 1T1R element, the second set voltage being greater than the first set voltage; and if the second read value is above the target value range, applying a reset gate voltage to the gate of the 1T1R element and a reset voltage to a second electrode of the memristor.

2. The method of claim 1, further comprising:
determining a second gate voltage of a second 1T1R element based on a second target value;
simultaneously reading a second value of the second 1T1R element and the first value of the first 1T1R element the first time;
if the second value read the first time is below a second target value range, applying the second gate voltage to the second gate of the second 1T1R element and the first set voltage to a second electrode of the second memristor of the second 1T1R element.

3. The method of claim 1, further comprising determining the gate voltage based on a gate voltage to value function approximated from a data set.

4. The method of claim 3, further comprising storing historical information of voltages applied to the memristor and wherein the gate voltage is further based on the historical information.

5. The method of claim 1, further comprising, obtaining a second target value different from the first target value, and applying an initialization voltage pulse to the memristor.

6. The method of claim 5, further comprising:
determining the gate voltage based on a gate voltage to value function approximated from a data set;
reading the value of the 1T1R element after applying the initialization set voltage; and
adding the value read after applying the initialization set voltage to the data set.

7. The method of claim 1, further comprising alternatingly applying increasing set voltages to the 1T1R element and reading the value of the 1T1R element until the value read is within the target value range or the value read is above the target value range.

8. A system, comprising:
a memory element comprising a memristor coupled to an access transistor;
a controller coupled to the memory element, the controller comprising logic to:
receive a target value for the memristor;
determine a set gate voltage for a gate of the access transistor based on the target value and historical information regarding the memory element; and
with the gate of the access transistor held at the set gate voltage, apply increasing set voltage pulses to the memristor until a value of the memristor is within a range about the target value or the value of the memristor overshoots the target value.

9. The system of claim 8, further comprising:
a set of memory elements, each respective memory element comprising a respective memristor and a respective access transistor, wherein the memory element is an element of the set of memory elements; and wherein the controller is to independently control the access transistors of at least a subset of the set of memory elements.

10. The system of claim 8, wherein the controller is to:
if the value of the memristor overshoots the target value, with the gate of the access transistor held at a reset gate voltage, apply increasing reset voltage pulses to the memristor until the value of the memristor is within the range about the target value or the value of the memristor undershoots the target value.

11. The system of claim 10, wherein the controller is to receive a second target value for the memristor and to apply an initialization voltage pulse prior to applying increasing set or reset voltage pulses.

12. The system of claim 11, wherein the controller is to determine a gate voltage for a set initialization voltage pulse based on the second target value.

13. The system of claim 11, wherein the controller is to determine the set gate voltage from a relationship between target values and gate set voltages; and the system further comprising logic to refine the relationship based on the value of memristor after reading the memristor.

14. The system of claim 10, wherein the controller is to determine the reset gate voltage from a relationship between target values and gate reset voltages.

15. A controller comprising logic to:
receive a target value for a memristor;
perform a set of write attempts for the memristor until a value of the memristor is within a range about the target value or a maximum number of write attempts is reached, each write attempt comprising:
reading a current value of the memristor;
if the current value is below the threshold of the target value, setting an access transistor gate voltage to a set gate voltage determined based on the target value and applying a set pulse to the memristor; and
if the current value is above the threshold of the target value, setting the access transistor gate voltage to a reset gate voltage and applying a reset pulse to the memristor.

16. The controller of claim 15, comprising logic to:
receive an instruction to set the maximum number of write attempts.

17. The controller of claim 15, comprising logic to:
receive a number of possible values for the memristor and to determine the maximum number of write attempts from the maximum number of values.

18. The controller of claim 15, wherein within the set of write attempts, each set pulse directly following a preceding set pulse has a larger voltage than the preceding set pulse.

19. The method of claim 1, further comprising determining the reset voltage based on the target conductance.

20. The method of claim 1, further comprising determining the reset voltage independently of the target conductance.

* * * * *